June 26, 1962 W. J. ROBERTSON ETAL 3,041,452

TUNNEL DIODE FREQUENCY CONVERSION CIRCUIT

Filed Oct. 13, 1960

INVENTORS
William J. Robertson
John Q. Copeland
By Anthony D. Cennamo

United States Patent Office 3,041,452 Patented June 26, 1962

3,041,452

TUNNEL DIODE FREQUENCY CONVERSION CIRCUIT

William J. Robertson and John R. Copeland, Columbus, Ohio, assignors to The Ohio State University Research Foundation Filed Oct. 13, 1960, Ser. No. 62,432
8 Claims. (Cl. 325—439)

Figure 1:
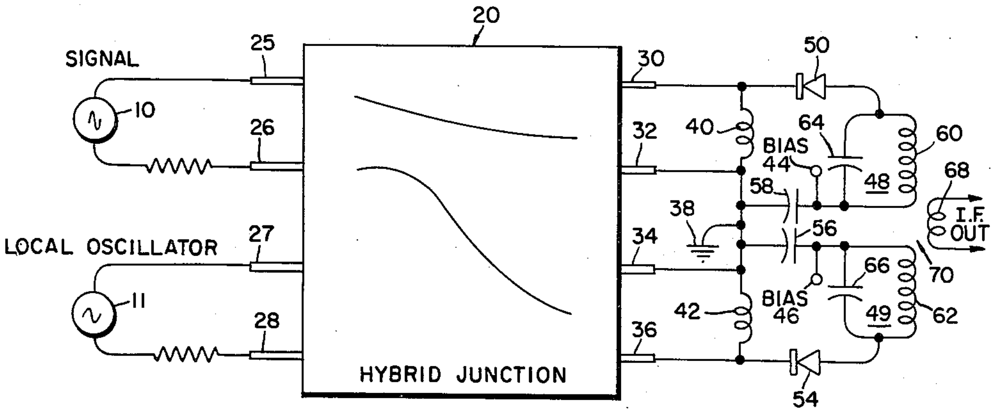

This invention generally relates to radio-frequency converter circuits, and more specifically to a new and improved stable wind band tunnel diode down converter.

In the conventional high frequency down converter, mixer diodes were employed, which characteristically were accompanied by an attendant loss and high-noise figure. The low-noise, high-gain, conversion of a high-frequency signal to a lower-frequency signal has not been possible with previous mixer devices. Ordinary crystal mixers, which make use of the nonlinearity of their positive resistance, exhibit a conversion loss and a poor noise figure. Typical values of noise figure for these conventional diodes are 9 to 13 db.

The recently introduced parametric converters, which operate on a nonlinear capacitance or inductance basis, have achieved good noise figures with up-conversion gain. The parametric down converters, however, again have poor noise factors. For such down converters, it is found that the excess noise figure (i.e., the noise figure minus unity) varies roughly as the ratio of the input frequency to the output frequency. Thus, for a ten-to-one frequency down-conversion, the noise figure is around 10 db. Because of this frequency dependence, it is almost impossible to convert a microwave frequency into a low intermediate frequency with a reasonable noise figure by parametric converters.

There recently has been developed, by Dr. Leo Esaki of Japan, another semi-conductor device, a negative resistive element commonly referred to as the tunnel diode. The tunnel diode has met with immediate and considerable success in today's electronics; and applications of the tunnel diode, as well as its electrical characteristics, performance data and improvements in operation, have found wide acclaim in the technical literature.

It has now been found that the unique volt-ampere characteristics of the tunnel diode has made it possible to design down converters with power gain and low noise figures. The non-linear resistance of the tunnel diode makes it extremely applicable to a down converter circuit. Since the nonlinearity of a resistance, not a reactance, is utilized for frequency conversion, the noise factor is independent of the ratio of the input frequency to the output frequency. Thus, by using a tunnel diode, a low-noise converter with conversion gain may be achieved. At least one down converter employing a tunnel diode as the resistive element together with tuned circuits has been reported. May 1960 Proceedings of the IRE by K. K. N. Chang, G. H. Heilmeier and H. J. Prages, titled "Low Noise Tunnel-Diode Down Converter Having Conversion Gain."

The primary disadvantage of a tunnel diode and tuned circuit down converter, is that it is an almost constant voltage gain-bandwidth product. More specifically, when high gains are obtained, the bandwidths become very small—typically a fraction of one percent of the signal frequency. A further disadvantage of such a down converter circuit is that it is unstable; that is, if the input impedance is changed by a small amount, the power gain suffers a large change and the circuit may break into oscillation.

The present invention teaches a tunnel diode down converter circuit having a power gain and low noise and that overcomes the disadvantage of having small bandwidth and also overcomes the disadvantage of being unstable. This unique result is obtained by the use of a hybrid junction together with the tunnel diodes to form the down converter circuit. The bandwidth of the down converter is limited only by the characteristic bandwidth of the hybrid junction—and at the present day development a hybrid junction having a bandwidth as large as four to one is commercially available. The highest frequency over which the down converter is operable is limited only by the frequency range of the available tunnel diodes. To date, tunnel diodes operable in the order of 3000 megacycles are available or in advanced stages of development. This invention has the further advantage of absolute stability at its input terminals due to the isolation provided by the hybrid junction and the balance of the tunnel diodes.

The unique low noise-broad band advantages of the down converter of the present invention make it particularly adaptable to commercial applications. One such application is a television converter in the VHF and UHF frequency bands.

Accordingly, it is a principal object of the present invention to provide a new and improved radio frequency converter circuit.

A further object of the present invention is to provide a new and improved radio frequency down converter circuit.

Another object of the present invention is to provide a down converter circuit having a high power gain and low noise figure.

Another object of the present invention is to provide a down converter circuit having a high power gain and low noise figure and further characterized as having a large bandwidth.

Another object of the present invention is to provide a down converter circuit employing tunnel diodes.

Another object of the present invention is to provide a tunnel diode down converter circuit that has absolute stability.

Still another object of the present invention is to provide a tunnel diode down converter circuit that may utilize commercially available hybrid junction circuits.

Figure 2:
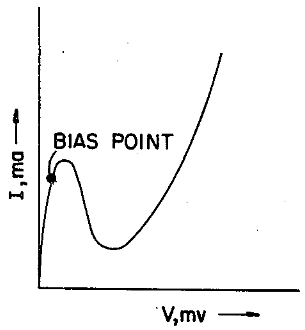
Figure 3:
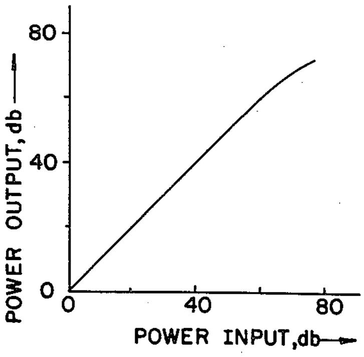

Further objects and features of the present invention will become apparent from the following detailed description when taken in conjunction with the drawings in which FIG. 1 is a schematic diagram of a hybrid coupled tunnel diode converter of the present invention;

FIG. 2 is a graph illustrating the tunnel diode current-voltage (I-V) characteristic; and, FIG. 3 is a graph illustrating the dynamic response of the tunnel diode down converter of the present invention.

Referring now to FIG. 1, there is shown a preferred embodiment of the present invention. Generally, conversion is accomplished by connecting the input signal and the local oscillator signal to a pair of arms of a hybrid junction. Connected to the two pairs of output arms of the hybrid junction are a pair of diodes in a balanced intermediate frequency tank circuit.

More specifically, the received or generated signal from source 10 is connected to the pair of arms 25 and 26 of hybrid junction 10, and the local oscillator signal from source 11 is connected to a pair of arms 27 and 28 of hybrid junction 20. In practice, the two pairs of arms will each probably be coaxial lines or alternatively may be waveguide lines. The hybrid junction 20 does not per se form a part of the invention as it is commercially available. One such hybrid junction that has been found suitable for use in the preferred embodiment is manufactured and sold by Sage Laboratories under Model 751. This particular hybrid junction is of the stripline type of conductors. According to the IRE Standards, a hybrid junction is defined as a "waveguide (including coaxial transmission line) arrangement with four branches which, when branches are properly terminated, has the property that energy can be transferred from any one branch into two of the remaining three. In common usage, this energy is equally divided between the two branches."

At the output side of the hybrid junction 20, there is connected a pair of tunnel diodes and a balanced tank circuit. Tunnel diode 50 is connected at one end to terminal 30 of the hybrid junction 20, and tunnel diode 54 has one end connected to terminal 36 of hybrid junction 20. Terminals 32 and 34 are grounded at common ground 38. Inductance 40 connected across terminals 30 and 32, and inductance 42 connected across terminals 34 and 36, are radio frequency isolating chokes. To the other side of tunnel diode 50 there is connected a tank circuit 48 comprising inductance 62 and capacitance 64; and to the other side of tunnel diode 54 there is connected a tank circuit 49 comprising inductance 62 and capacitance 66. Positioned adjacent the two inductances 60 and 62 is a pick-up loop 68. It is apparent to those skilled in the art that the two tuned circuits together with the pick-up loop form balanced intermediate frequency transformer 70. The center tap of the transformer 70 is opened so that the tunnel diodes 50 and 54 may be individually biased. Tunnel diode 50 is biased, as hereinafter set forth, from bias source 44 connected between tank circuit 48 and capacitor 58 having its other end connected to ground at 38. Tunnel diode 54 is biased from bias source 46 connected between tank circuit 49 and capacitor 56 having its other end also connected to ground at 38.

In operation of the preferred embodiment, when the two tunnel diodes 50 and 54 are biased near the peak current point in the positive conductance region of the current-voltage (I-V) characteristic as indicated in FIG. 2, the tunnel diodes appear as positive balanced loads to the local oscillator. Consequently, the hybrid action of the hybrid junction 20 causes cancellation of the local oscillator signal at the detected signal input terminals 25 and 26. When driven by the local oscillator, the tunnel diodes and intermediate frequency circuit appear as balanced negative conductances to the incoming detected signal. Hybrid action of the junction 20 isolates the signal input terminals 25 and 26 from the incoming signal source when the local oscillator, at its terminal points 34 and 36, is terminated in a matched load.

Measurements taken from a constructed embodiment of the circuit shown in FIG. 1 indicate that the power gain and noise figure are critically dependent upon the power input from the local oscillator. A power input of ten microwatts was required to yield maximum power gain and minimum noise figure. Hybrid action of the junction attenuates the local oscillator signal at the input terminal at least 20 db when the tunnel diodes are carefully matched. Stable small signal conversion gains up to 10 db were measured at a frequency of 400 mc. A two channel noise figure of 7 db was measured with a Hewlett Packard 342A noise figure meter at the 400 mc. At higher frequencies power gain and noise figure deteriorate because of the cutoff frequency of the available tunnel diodes that were used. With matched tunnel diodes, the down converter was proved to be both open and short circuit stable at the input terminals without the use of a nonreciprocal device. Therefore, if additional selectivity is desired, tuned circuits or filters may be employed at the input terminals without affecting stability. The dynamic response, i.e. power output vs. power input in terms of db, of the constructed and tested embodiment of the tunnel diode converter of the invention is shown in FIG. 3 to be linear over a wide range of signal amplitude.

Although the constructed embodiment of the hybrid coupled tunnel diode of the present invention performed satisfactorily in its intended manner, and further, even though it offers considerable advantage over the conventional crystal mixer in the UHF band further developments in the parameters per se will similarly improve the results obtainable. In particular, the use of gallium arsenide tunnel diodes may lower the noise figure to a more acceptable value. Also, the use of two-octave hybrids, which are now commercially available, together with the improved tunnel diodes, should make it possible to construct a down converter with a 6:1 frequency range.

Although a certain specific embodiment of the down converter circuit of the present invention is shown and described, it is to be understood that modifications and alterations may be made thereto without departing from the scope and spirit of theinvention. Further, with the present understanding of the developments of circuits generally described, it is believed that the greatest utility of the present invention is as a down-converter; however, the principles of the present invention with its attendant advantages also readily adapts itself to up-converters as well.

What we claim is:

1. A frequency conversion circuit including an incoming signal and a local oscillator signal, the improvement which comprises a hybrid junction having a pair of input terminals and a pair of output terminals, means connecting said incoming signal to one of said input terminals and means connecting said local oscillator signal to the other of said input terminals; a pair of matched tunnel diodes and a balanced intermediate frequency circuit, means connecting said diodes and said intermediate frequency circuit to said output terminals of said hybrid junction, and bias means for biasing said tunnel diodes near the peak current point in the positive conductance region of its current-voltage characteristic.

2. A converter circuit as set forth in claim 1, wherein said conversion action is downward in frequency.

3. A converter circuit as set forth in claim 1, wherein said intermediate frequency circuit comprises a tuned transformer, comprising a balanced tank circuit with the center tap of the inductor opened, and wherein said bias means for said tunnel diodes further comprises means for individually biasing each of said tunnel diodes.

4. A radio frequency conversion circuit for converting an incoming signal in frequency and including a local oscillator signal, the improvement which comprises a hybrid junction having a pair of input terminals and a pair of output terminals, means connecting said incoming signal to one of said input terminals and means connecting said local oscillator signal to the other of said input terminals; a pair of matched tunnel diodes and a balanced intermediate frequency circuit, and means connecting said diodes and said intermediate frequency circuit to said output terminals of said hybrid junction, and bias means for biasing each of said tunnel diodes to appear as positive balanced loads to the local oscillator to cause cancellation of the local oscillator signal at said incoming signal input terminal of said hybrid junction.

5. A converter circuit as set forth in claim 4, wherein said intermediate frequency circuit comprises a tuned transformer, comprising a balanced tank circuit with the center tap of the inductor opened, and wherein said bias means for said tunnel diodes further comprises means for individually biasing each of said tunnel diodes.

6. A converter circuit as set forth in claim 4, wherein said conversion action is downward in frequency.

7. A converter circuit as set forth in claim 4, wherein said hybrid junction isolates said incoming signal input terminals from said incoming signal when said local oscillator is terminated in a matched load.

8. A converter circuit as set forth in claim 4, wherein said bias means further comprises isolating means between said pair of output terminals.

References Cited in the file of this patent

UNITED STATES PATENTS

| | | |
|---|---|---|
| 2,469,222 | Atwood et al. | May 3, 1949 |
| 2,628,308 | Norton | Feb. 10, 1953 |

| | | |
|---|---|---|
| 2,834,876 | Pritchard et al. | May 13, 1958 |
| 2,909,655 | Sanner | Oct. 20, 1959 |
| 2,978,576 | Watters | Apr. 4, 1961 |

OTHER REFERENCES

Chang et al.: "Low-Noise Tunnel-Diode Down Converter Having Conversion Gain," Proceedings IRE, May 1960, pages 854–858.